US011469075B2

(12) United States Patent
Chang

(10) Patent No.: US 11,469,075 B2
(45) Date of Patent: *Oct. 11, 2022

(54) IDENTIFYING FIDUCIAL MARKERS IN MICROSCOPE IMAGES

(71) Applicant: Applied Materials, Inc, Santa Clara, CA (US)

(72) Inventor: Yun-Ching Chang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 277 days.

This patent is subject to a terminal disclaimer.

(21) Appl. No.: 16/817,382

(22) Filed: Mar. 12, 2020

(65) Prior Publication Data

US 2020/0294763 A1    Sep. 17, 2020

Related U.S. Application Data

(60) Provisional application No. 62/858,936, filed on Jun. 7, 2019, provisional application No. 62/818,606, filed on Mar. 14, 2019.

(51) Int. Cl.
*H01J 37/26* (2006.01)
*G02B 21/00* (2006.01)
(Continued)

(52) U.S. Cl.
CPC .......... *H01J 37/26* (2013.01); *G01N 21/6458* (2013.01); *G02B 21/0076* (2013.01);
(Continued)

(58) Field of Classification Search
CPC .. H01J 37/26; H01J 2237/2602; H01J 37/265; H01J 2237/221; G01N 21/6458;
(Continued)

(56) References Cited

U.S. PATENT DOCUMENTS 7,139,415 B2    11/2006  Finkbeiner
7,826,977 B2    11/2010  Garty et al.
(Continued)

FOREIGN PATENT DOCUMENTS

JP      H06-004601      1/1994
KR      10-2014-0107323 9/2014
(Continued)

OTHER PUBLICATIONS

Moffitt et al., "High-throughput single-cell gene-expression profiling with multiplexed error-robust fluorescence in situ hybridization", PNAS, Sep. 27, 2016, 113(39):11046-51.
(Continued)

*Primary Examiner* — David P Porta
*Assistant Examiner* — Meenakshi S Sahu
(74) *Attorney, Agent, or Firm* — Fish & Richardson P.C.

(57) ABSTRACT

Methods, systems, and apparatus, including computer programs encoded on a computer storage medium, for obtaining a microscope image that depicts a sample and a plurality of fiducial markers, identifying the plurality of fiducial markers in the image, and using the plurality of fiducial markers to register the image. Identifying the plurality of fiducial markers in the image includes comparing a spatial intensity distribution of a plurality of regions of the image to a reference distribution function.

20 Claims, 5 Drawing Sheets

(51) Int. Cl.
 *G02B 21/36* (2006.01)
 *G02B 27/32* (2006.01)
 *G01N 21/64* (2006.01)

(52) U.S. Cl.
 CPC .............. *G02B 21/36* (2013.01); *G02B 27/32* (2013.01); *G01N 2021/6439* (2013.01); *H01J 2237/2602* (2013.01)

(58) Field of Classification Search
 CPC ........ G01N 2021/6439; G02B 21/0076; G02B 21/36; G02B 27/32; G02B 21/16; G02B 21/365
 See application file for complete search history.

(56) References Cited

U.S. PATENT DOCUMENTS

| | | | |
|---|---|---|---|
| 7,916,304 | B2 | 3/2011 | Hess |
| 7,977,625 | B2 | 7/2011 | Schwertner |
| 8,664,589 | B2 | 3/2014 | Clem et al. |
| 9,029,159 | B2 | 5/2015 | Furrer et al. |
| 9,104,903 | B2 | 8/2015 | Callahan et al. |
| 9,339,194 | B2 | 5/2016 | Adams |
| 9,494,521 | B2 | 11/2016 | Holmes et al. |
| 9,910,255 | B2 | 3/2018 | Berner |
| 10,066,934 | B2 | 9/2018 | Tsuyuki et al. |
| 10,302,569 | B2 | 5/2019 | Matsumoto et al. |
| 10,725,279 | B2 | 7/2020 | Hua et al. |
| 11,255,785 | B2 * | 2/2022 | Chang ................ G02B 21/0076 |
| 2007/0081231 | A1 | 4/2007 | Shirota et al. |
| 2011/0002530 | A1 | 1/2011 | Zhuang et al. |
| 2011/0293154 | A1 | 12/2011 | Mexiner et al. |
| 2012/0033867 | A1 | 2/2012 | Christiansen et al. |
| 2013/0096392 | A1 * | 4/2013 | Adams ................ A61B 5/0205 600/301 |
| 2013/0126759 | A1 | 5/2013 | Betzig et al. |
| 2014/0038289 | A1 | 2/2014 | Nieh et al. |
| 2014/0126801 | A1 * | 5/2014 | Callahan ............ G01N 23/2251 250/311 |
| 2016/0083783 | A1 | 3/2016 | Blainey et al. |
| 2016/0195705 | A1 | 7/2016 | Betzig et al. |
| 2018/0031817 | A1 | 2/2018 | Barral |
| 2018/0232883 | A1 | 8/2018 | Sethi et al. |
| 2018/0356343 | A1 | 12/2018 | Neuman et al. |
| 2019/0005304 | A1 | 1/2019 | Adalsteinsson et al. |
| 2019/0284552 | A1 | 9/2019 | Collins et al. |
| 2019/0331907 | A1 | 10/2019 | Franke et al. |
| 2020/0292455 | A1 | 9/2020 | Chang et al. |
| 2020/0294763 | A1 | 9/2020 | Chang et al. |
| 2022/0163781 | A1 | 5/2022 | Chang |

FOREIGN PATENT DOCUMENTS

| | | |
|---|---|---|
| WO | WO 03/105675 | 12/2003 |
| WO | WO 2018/231204 | 12/2018 |

OTHER PUBLICATIONS

PCT International Search Report and Written Opinion in International Application No. PCT/US2020/022336, dated Jul. 2, 2020, 11 pages.
Office Action in European Appln. No. 20770335.6, dated Oct. 21, 2021, 3 pages.
Liu et al., "Microfluidic device as a new platform for immunofluorescent detection of viruses," Lab on a Chip, 2005, 5(11):1327-30.

* cited by examiner

IDENTIFYING FIDUCIAL MARKERS IN MICROSCOPE IMAGES

CROSS-REFERENCE TO RELATED APPLICATIONS

This application claims priority to U.S. Provisional Application Ser. No. 62/858,936, filed on Jun. 7, 2019, and to U.S. Provisional Application Ser. No. 62/818,606, filed on Mar. 14, 2019, the disclosures of which are incorporated by reference.

BACKGROUND

This specification relates to processing microscope images, e.g., fluorescence microscope images or electron microscope images.

A fluorescent dye refers to a substance that emits light of a particular wavelength (e.g., having a particular color) in response to being exposed to light of a wavelength that "excites" the fluorescent dye. Fluorescent dyes can bind to (i.e., "label") other structures (e.g., RNA molecules, proteins, antibodies, or fiducial beads).

A fluorescence microscope is an optical microscope that generates an image by exposing the contents of a microscope slide to light of the wavelength that excites fluorescent dyes labeling the contents of the microscope slide.

An electron microscope generates an image by exposing the contents of the microscope slide to a beam of electrons. Examples of electron microscopes include transmission electron microscopes, scanning electron microscopes, and reflection electron microscopes.

The contents of a microscope slide can include a sample and a set of fiducial markers. The sample can be any appropriate organic or inorganic specimen, for example, a collection of cells from plant or animal tissue. The fiducial markers are objects (e.g., beads or nanoparticles) placed (e.g., in random positions) on the microscope slide to facilitate registration of images of the microscope slide taken at different time points. A sample or a fiducial marker is said to "have" a fluorescence color if it has been labeled with fluorescent dye that emits light of a wavelength corresponding to the color.

Registering a first image to a second image refers to determining the parameters of a "registration transformation" (e.g., an affine or elastic transformation) that can be applied to the first image to align it with the second image.

SUMMARY

This specification describes a fiducial identification system implemented as computer programs on one or more computers in one or more locations that can process an image depicting a sample and a set of fiducial markers to identify the positions of the fiducial markers.

According to one aspect, there is provided a method performed by one or more data processing apparatus, the method comprising: obtaining a microscope image that depicts a sample and a plurality of fiducial markers; identifying the plurality of fiducial markers in the image, including comparing a spatial intensity distribution of a plurality of regions of the image to a reference distribution function; and using the plurality of fiducial markers to register the image.

In some implementations, obtaining the microscope image comprises obtaining an electron microscope image.

In some implementations, the plurality of fiducial markers comprise metal nanoparticles.

In some implementations, the metal nanoparticles comprise one or more of: gold nanoparticles, silver nanoparticles, copper nanoparticles, and cobalt nanoparticles.

In some implementations, the plurality of fiducial markers comprise metal oxide nanoparticles.

In some implementations, the metal oxide nanoparticles comprise one or more of: $Fe_3O_4$ nanoparticles, $TiO_2$ nanoparticles, and $SiO_2$ nanoparticles.

In some implementations, the method further comprises: obtaining a fluorescence microscope image that depicts the sample and the plurality of fiducial markers; wherein using the plurality of fiducial markers to register the image comprises: using the plurality of fiducial markers to register the electron microscope image and the fluorescence microscope image.

In some implementations, comparing the spatial intensity distribution of the plurality of regions of the image to the reference distribution function comprises, for each region: determining respective parameter values of the reference distribution function that fit the reference distribution function to the spatial intensity distribution of the region.

In some implementations, the method further comprises, for each region: determining a similarity measure between the reference distribution function with the respective parameter values and the spatial intensity distribution of the region; and determining whether the region corresponds to a fiducial marker based at least in part on the similarity measure between the reference distribution function with the respective parameter values and the spatial intensity distribution of the region.

In some implementations, the method further comprises, for each region: determining whether the region corresponds to a fiducial marker based at least in part on the respective parameter values of the reference distribution function.

In some implementations, the reference distribution function is a two-dimensional Normal distribution function; and determining respective parameter values of the reference distribution function comprises determining respective mean and covariance parameter values of the reference distribution function.

In some implementations, determining the similarity measure between the reference distribution function with the respective parameter values and the spatial intensity distribution of the region comprises: determining a mean-squared-error (MSE) between the reference distribution function with the respective parameter values and the spatial intensity distribution of the region.

In some implementations, identifying the plurality of fiducial markers comprises: determining a respective area of each of the plurality of regions of the image; and for each region, determining whether the region corresponds to a fiducial marker based at least in part on the area of the region.

In some implementations, the sample comprises RNA molecules and the fiducial markers are beads.

According to another aspect, there is provided a method performed by one or more data processing apparatus, the method comprising: obtaining a fluorescence microscope image that depicts a sample and a plurality of fiducial markers, the sample and the plurality of fiducial markers having a common fluorescence color; identifying the plurality of fiducial markers in the image, including comparing a spatial intensity distribution of a plurality of fluorescent regions of the image to a reference distribution function; and using the plurality of fiducial markers to register the image.

In some implementations, comparing the spatial intensity distribution of the plurality of fluorescent regions of the image to the reference distribution function comprises, for each fluorescent region: determining respective parameter values of the reference distribution function that fit the reference distribution function to the spatial intensity distribution of the fluorescent region.

In some implementations, the method further comprises, for each fluorescent region: determining a similarity measure between the reference distribution function with the respective parameter values and the spatial intensity distribution of the fluorescent region; and determining whether the fluorescent region corresponds to a fiducial marker based at least in part on the similarity measure between the reference distribution function with the respective parameter values and the spatial intensity distribution of the fluorescent region.

In some implementations, the method further comprises, for each fluorescent region: determining whether the fluorescent region corresponds to a fiducial marker based at least in part on the respective parameter values of the reference distribution function.

In some implementations, the reference distribution function is a two-dimensional Normal distribution function; and determining respective parameter values of the reference distribution function comprises determining respective mean and covariance parameter values of the reference distribution function.

In some implementations, determining the similarity measure between the reference distribution function with the respective parameter values and the spatial intensity distribution of the fluorescent region comprises: determining a mean-squared-error (MSE) between the reference distribution function with the respective parameter values and the spatial intensity distribution of the fluorescent region.

In some implementations, identifying the plurality of fiducial markers comprises: determining a respective area of each of the plurality of fluorescent regions of the image; and for each fluorescent region, determining whether the fluorescent region corresponds to a fiducial marker based at least in part on the area of the fluorescent region.

In some implementations, the sample comprises RNA molecules and the fiducial markers are beads.

According to another aspect, there is provided a system comprising one or more computers and one or more storage devices storing instructions that when executed by the one or more computers cause the one or more computers to perform the operations of the described method.

According to another aspect, there are provided one or more computer storage media storing instructions that when executed by one or more computers cause the one or more computers to perform the operations of the described method.

Particular embodiments of the subject matter described in this specification can be implemented so as to realize one or more of the following advantages. The fiducial identification system can be used to register images (e.g., fluorescence images captured at different time points) using fewer resources and more accurately than some conventional systems.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
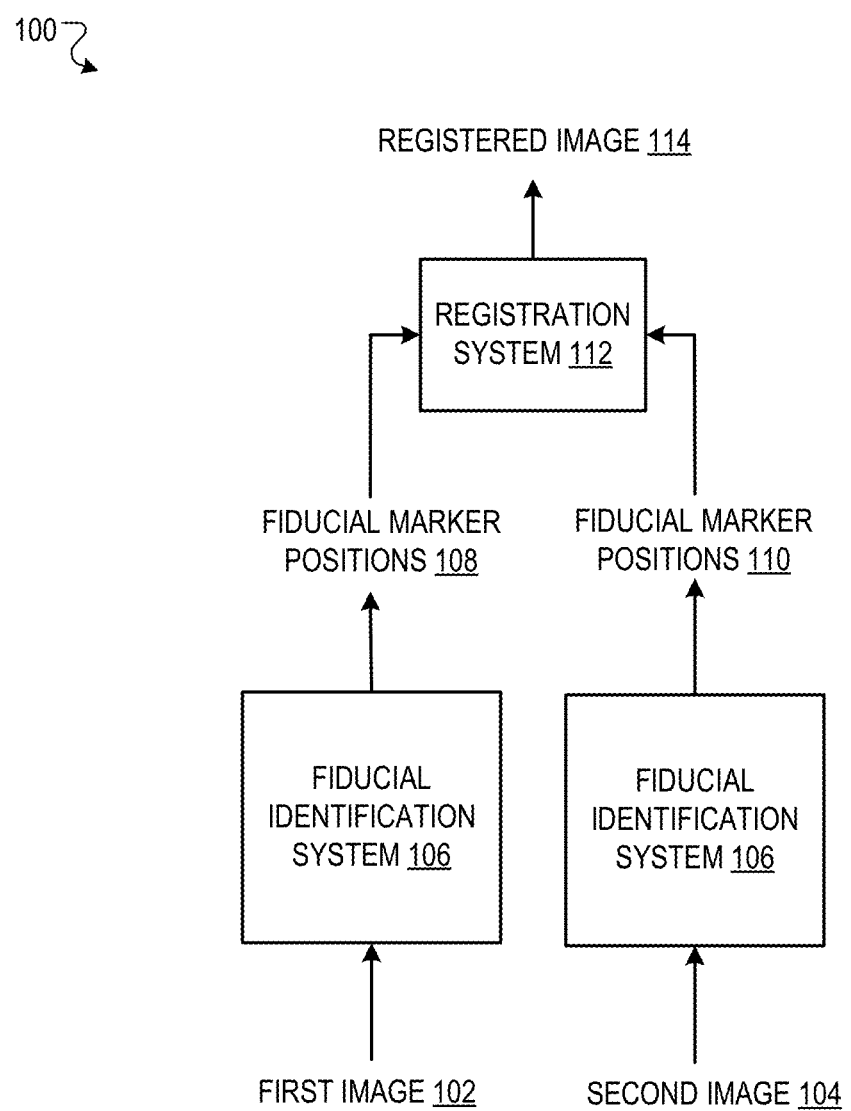
FIG. 1 illustrates an example data flow for registering a "first" microscope image to a "second" microscope image using a fiducial identification system.

This specification describes a fiducial identification system for identifying fiducial markers in a microscope image of a microscope slide containing fiducial markers and a sample. In one example, the microscope image may be a fluorescence microscope image where the fiducial markers and the sample have a common fluorescence color. The microscope image depicts both the fiducial markers and the sample. The fiducial markers identified in the image can be used to register the image to other images of the microscope slide, e.g., images of the microscope slide taken at different time points, or images of the microscope slide taken by microscopes with different imaging modalities.

In some situations, it is beneficial to take pictures of a certain portion of a sample at different times, e.g., if certain properties of the sample change over time. An issue is that in some situations, the carrier material on the microscope slide can move or samples desired to be imaged can move within the carrier material. For example, samples suspended in a liquid could move. In this case, even if the stage supporting the slide is moved accurately to the same position, the sample may no longer be in the same location in the later image, which can make comparison of the images of the sample difficult. A technique to compensate for this motion is to place fiducial markers, e.g., fluorescent beads, within the carrier material on the slide. In general, the sample and the fiducial marker beads will move approximately in unison. Comparison of the positions of the fiducial markers permits registration of the two images.

In some conventional fluorescence imaging systems, the sample and the fiducial markers used to perform the registration are required to have different fluorescence colors. At each of multiple time points, two fluorescent microscope images are captured: one depicting only the sample (i.e., with the first fluorescence color), and one depicting only the fiducial markers (i.e., with the second fluorescence color). The registration transformation used to register fluorescent images depicting the sample at different time points is determined by processing fluorescent images depicting the fiducial markers at the respective time points.

In contrast, the fiducial identification system described in this specification can process a fluorescence microscope image that depicts both the sample and the fiducial markers to identify the positions of the fiducial markers. Therefore, using the fiducial identification system, the sample and the fiducial markers can have the same fluorescence color, and only one fluorescence microscope image (i.e., which depicts both the sample and the fiducial markers) is captured at each time point. To register fluorescent images captured at different time points, the fiducial identification system is used to identify the positions of the fiducial markers depicted in the images, and the positions of the fiducial markers are used to determine the appropriate registration transformation. Therefore, the fiducial identification system described in this specification reduces resource usage by requiring only one fluorescence microscope image to be captured at each time point (i.e., rather than two, as in some conventional systems).

Moreover, chromatic aberration effects (i.e., where the lens of the fluorescence microscope focuses different colors to different points) may result in fiducial markers having a first fluorescence color being localized inconsistently with a sample having a second fluorescence color. Therefore, in conventional systems where the fiducial markers and the sample have different fluorescence colors, the registration transformation determined based on the fiducial markers may be inappropriate for use in registering the sample between different time points. The fiducial identification system described in this specification obviates this potential source of registration error by enabling the fiducial markers and the sample to have a common fluorescence color.

The fiducial identification system described in this specification can facilitate registration of microscope images generated using different imaging modalities. For example, the fiducial identification system can be used to register a fluorescence microscope image and an electron microscope image that each depict the same sample and fiducial markers. In this example, the fiducial markers may be, e.g., metal nanoparticles or metal oxide nanoparticles that are visible in both the fluorescence microscope image (e.g., due to fluorescence) and the electron microscope image (e.g., due to photoluminescence).

FIG. 1 illustrates an example data flow 100 for registering a "first" microscope image 102 to a "second" microscope image 104 using a fiducial identification system 106. The first image 102 and the second image 104 are respective images of the contents of a microscope slide that are, e.g., captured by a fluorescence microscope at different time points (e.g., 30 minutes apart), or captured by microscopes having different modalities (e.g., a fluorescence microscope and an electron microscope). In some cases, the microscope slide contains a sample and a set of fiducial markers having the same fluorescence color, referred to in this specification as the "target" fluorescence color. In some cases, the fiducial markers are metal nanoparticles (e.g., gold nanoparticles, silver nanoparticles, copper nanoparticles, or cobalt nanoparticles) or metal oxide nanoparticles (e.g., $Fe_3O_4$ nanoparticles, $TiO_2$ nanoparticles, or $SiO_2$ nanoparticles).

In one example, the contents of the microscope slide include a collection of ribonucleic acid (RNA) molecules and fiducial marker beads suspended in a microfluidic chamber. Between the first image 102 and the second image 104 being captured, the RNA molecules and the fiducial marker beads may have moved in the microfluidic chamber. In this example, the RNA molecules and the fiducial marker beads move approximately in unison (i.e., so the relative positions of RNA molecules and the fiducial marker beads remain approximately the same between time points).

A microscope image (e.g., the first image 102 or second image 104) can be represented as a two-dimensional (2D) array of numerical values (e.g., floating point values). Each component of the array is referred to as a "pixel" and has a value that defines, e.g., the intensity of light having the target fluorescent color that is received from a respective spatial position of the microscope slide, or characteristics of an electron beam that passes through a respective spatial position of the microscope slide.

The fiducial identification system 106 is configured to process the first image 102 and the second image 104 to generate the respective fiducial marker positions 108 and 110. The fiducial marker positions for an image (e.g., the first image 102 or the second image 104) define the positions of the fiducial markers depicted in the image. The position of a particular fiducial marker can be represented as a set of coordinates, for example, x-y coordinates in a frame of second of the image. The fiducial identification system 106 will be described in more detail with reference to FIG. 2.

The registration system 112 is configured to process the fiducial marker positions 108 and 110 to determine the parameters of a "registration transformation" that can be applied to the first image 102 to align it with the second image 104. The transformation may be, for example, an affine transformation (e.g., represented by a 3×3 matrix defining translation, rotation, and shearing operations) or an elastic transformation (e.g., represented by an array of displacement vectors defining a respective displacement for each pixel of the first image).

The registration system 112 applies the registration transformation to the first image 102 to generate the registered image 114. The registered image 114 is "aligned" with the second image 104, that is, each pixel of the registered image 114 characterizes the same spatial position on the microscope slide as the corresponding pixel from the second image 104. An example process for registering a first image to a second image is described in more detail with reference to FIG. 6.

Figure 2:
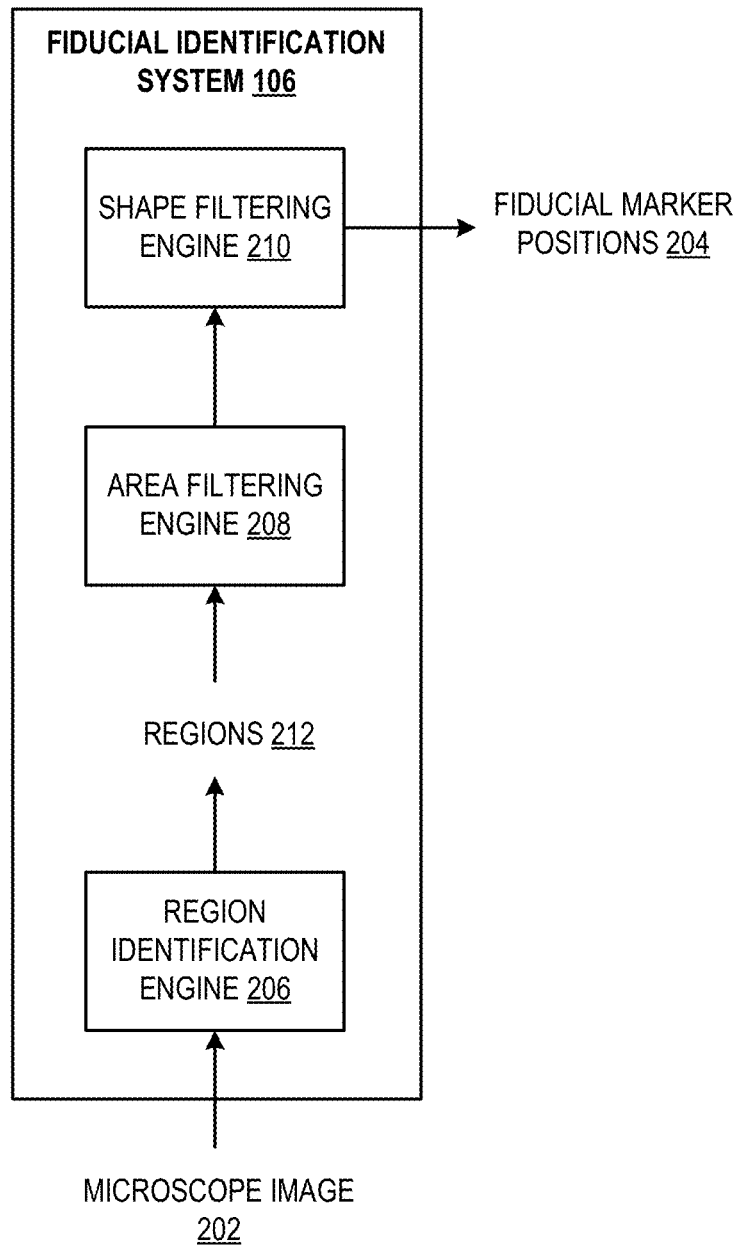
FIG. 2 shows an example fiducial identification system.

FIG. 2 shows an example fiducial identification system 106. The fiducial identification system 106 is an example of a system implemented as computer programs on one or more computers in one or more locations in which the systems, components, and techniques described below are implemented.

The fiducial identification system 106 is configured to process a microscope image 202 depicting a sample and a set of fiducial markers to generate a set of fiducial marker positions 204. As described earlier, each fiducial marker position 204 defines the location of a respective fiducial marker in the image 202 and can be represented by a set of coordinates (e.g., x-y coordinates).

In one implementation, the microscope image 202 may be a fluorescence microscope image depicting a sample and a set of fiducial markers having the same fluorescence color. In another implementation, the microscope image 202 may be an electron microscope image depicting a sample and a set of fiducial markers.

The system 106 includes a region identification engine 206, an area filtering engine 208, and a shape filtering engine 210.

The region identification engine 206 is configured to process the image 202 to identify a set of contiguous and non-overlapping regions 212 of the image 202. To determine the regions 212, the region identification engine 206 "thresholds" the image 202 to identify each pixel that has an intensity that is in a predetermined range of values, e.g., that exceeds a predetermined threshold value. Thereafter, the region identification engine 206 partitions the identified pixels into respective regions, such that: (i) each identified pixel is included in one region, and (ii) any two adjacent identified pixels are included in the same region.

Optionally, prior to thresholding the image 202, the region identification engine 206 may enhance the signal-to-noise ratio (SNR) of the image 202 by processing the image 202 using one or more filters. For example, the region identification engine 206 may process the image 202 using a smoothing 2D Normal filter.

Each region 212 may correspond to: (i) a fiducial marker, (ii) a portion or all of the sample, or (iii) "noise" caused by random intensity variations in the image 202. The system 106 uses the area filtering engine 208 and the shape filtering engine 210 to identify a proper subset of the regions 212 that correspond to fiducial markers based on prior knowledge of the expected characteristics of regions corresponding to fiducial markers.

The area filtering engine 208 is configured to determine the area of each region 212, and thereafter identify each region with an area that is consistent with being a fiducial marker. For example, the fiducial markers may be beads labeled with fluorescent dye. Prior calibration experiments may have been conducted to generate images depicting only beads to determine that the expected area of a region corresponding to a bead is in a particular range (e.g., 100-200 nm$^2$). In this example, the area filtering engine 208 may identify a region as having an area consistent with being a fiducial marker if the area of the region is in the particular range. For convenience, a region with an area that is consistent with being a fiducial marker is referred to in this specification as a "candidate" region. Generally, the area of a region can be determined as a product of: (i) the number of pixels in the region, and (ii) the known area of each pixel in the image (i.e., which depends on the magnification level of the microscope).

The shape filtering engine 210 is configured to identify each candidate region where the "shape" of the spatial intensity distribution within the candidate region is consistent with the candidate region being a fiducial marker. The shape filtering engine 210 determines the shape of the spatial intensity distribution within a candidate region by comparing it to a "reference" distribution function. The spatial intensity distribution within a candidate region is defined by the respective location and intensity of each pixel contained in the candidate region. The reference distribution function is a parametric function (i.e., mapping 2D spatial positions to corresponding intensity values) that models the expected spatial intensity distribution within regions corresponding to fiducial markers.

In one example, the reference distribution function may be a 2D Normal distribution function with a diagonal covariance matrix. In this example, the reference distribution function is parametrized by: (i) a mean parameter μ, and (ii) a covariance parameter a defining the diagonal values of the covariance matrix. A reference distribution function in this form may be appropriate for modeling the spatial intensity distribution corresponding to fiducial markers, e.g., rounded beads labeled with fluorescent dye.

The shape filtering engine 210 compares the spatial intensity distribution within a candidate region to the reference distribution function by "fitting" the reference distribution function to the spatial intensity distribution within the candidate region. That is, the shape filtering engine 210 determines the values of the parameters of the reference distribution function which cause it to best fit the spatial intensity distribution within the candidate region. The shape filtering engine 210 can fit the reference distribution function to the spatial intensity distribution within the candidate region using any appropriate fitting technique, for example, a maximum likelihood estimation (MLE) technique.

The shape filtering engine 210 determines whether a candidate region corresponds to a fiducial marker based on the reference distribution function fitted to the spatial intensity distribution within the candidate region. A few examples follow.

For example, the shape filtering engine 210 may determine a candidate region corresponds to a fiducial marker only if the values of one or more parameters of the fitted reference distribution function are within respective predetermined ranges. For example, the shape filtering engine 210 may determine that a candidate region corresponds to a fiducial marker only if the covariance parameter a of a 2D Normal reference distribution function (described earlier) is within a particular predetermined range. The predetermined range may be determined during calibration experiments (as described earlier).

As another example, the shape filtering engine 210 may determine a candidate region corresponds to a fiducial marker only if a similarity measure between the fitted reference distribution function and the spatial intensity distribution within the candidate region is within a predetermined range. For example, the similarity measure may be a mean-squared-error (MSE) similarity measure given by:

$$MSE = \frac{1}{|F|}\sum_{p \in F}(I[p] - \mathcal{R}[p])^2 \qquad (1)$$

where |F| is the number of pixels in the candidate region, the sum is over each pixel p in the candidate region, I[p] is the intensity of pixel p, and R[p] is the value assigned to pixel p by the fitted reference distribution function. In this example, the shape filtering engine 210 may determine the candidate region corresponds to a fiducial marker only if the MSE is below a predetermined threshold. The predetermined threshold may be determined during calibration experiments (as described earlier).

The system 106 outputs a respective fiducial marker position 204 for each candidate region that the shape filtering engine 210 identifies as corresponding to a fiducial marker. The system 106 may determine the fiducial marker position of a candidate region identified as being a fiducial marker as: (i) the mean of the reference distribution function fitted to the spatial intensity distribution within the candidate region, (ii) the position of the pixel in the candidate region with the highest intensity, or (iii) the centroid of the candidate region.

The fiducial marker positions 204 in the image 202 can be used to register the image 202, as described with reference to FIG. 1.

Optionally, the system 106 can use one or more additional criteria (e.g., implemented by respective "filtering engines") to further refine the set of regions that are identified as being fiducial markers.

Figure 3:
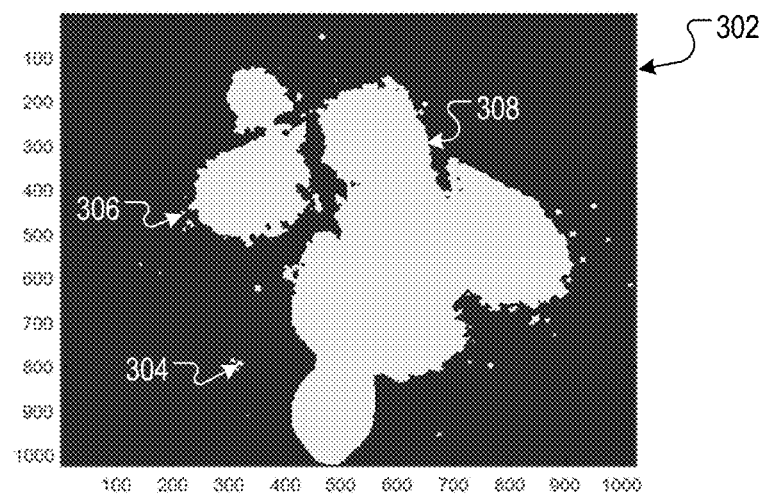
FIG. 3 illustrates a set of fluorescent regions in a fluorescence microscope image.

FIG. 3 illustrates a set of fluorescent regions in a fluorescence microscope image 302. Each pixel in the image 302 having a white color is a fluorescent pixel, and each pixel having a black color is a non-fluorescent pixel. The fluorescent region 304 corresponds to a fiducial marker bead, while the fluorescent regions 306, 308 correspond to a sample.

Figure 4A:
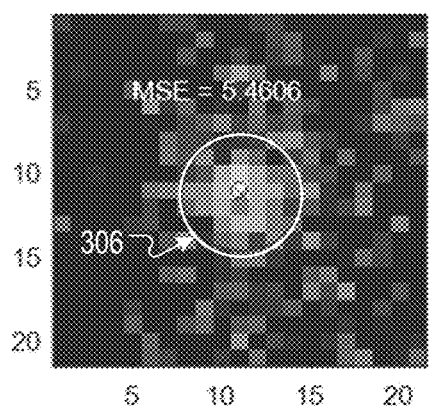
FIGS. 4A and 4B illustrate spatial intensity distributions within respective fluorescent regions.

FIG. 4A illustrates the spatial intensity distribution inside the fluorescent region 306. The MSE between: (i) a 2D Normal reference distribution function with a diagonal covariance matrix, and (ii) the spatial intensity distribution within the fluorescent region 306, is 5.4606. The fiducial identification system 106 may determine the fluorescent region 306 is not a fiducial marker bead based in part on this MSE value.

Figure 4B:
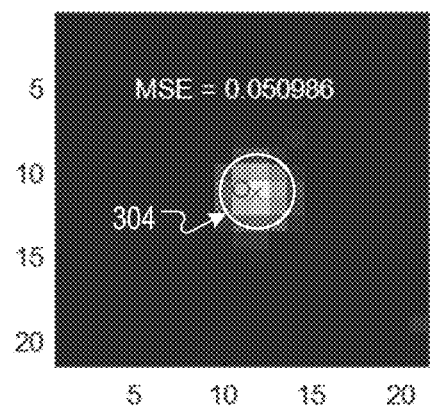

FIG. 4B illustrates the spatial intensity distribution inside the fluorescent region 304. The MSE between: (i) a 2D Normal reference distribution function with a diagonal covariance matrix, and (ii) the spatial intensity distribution within the fluorescent region 304, is 0.050986. The fiducial identification system 106 may determine the fluorescent region 304 is a fiducial marker bead based in part on this MSE value (which is substantially lower than the MSE value for the non-fiducial fluorescent region 306).

Figure 5:
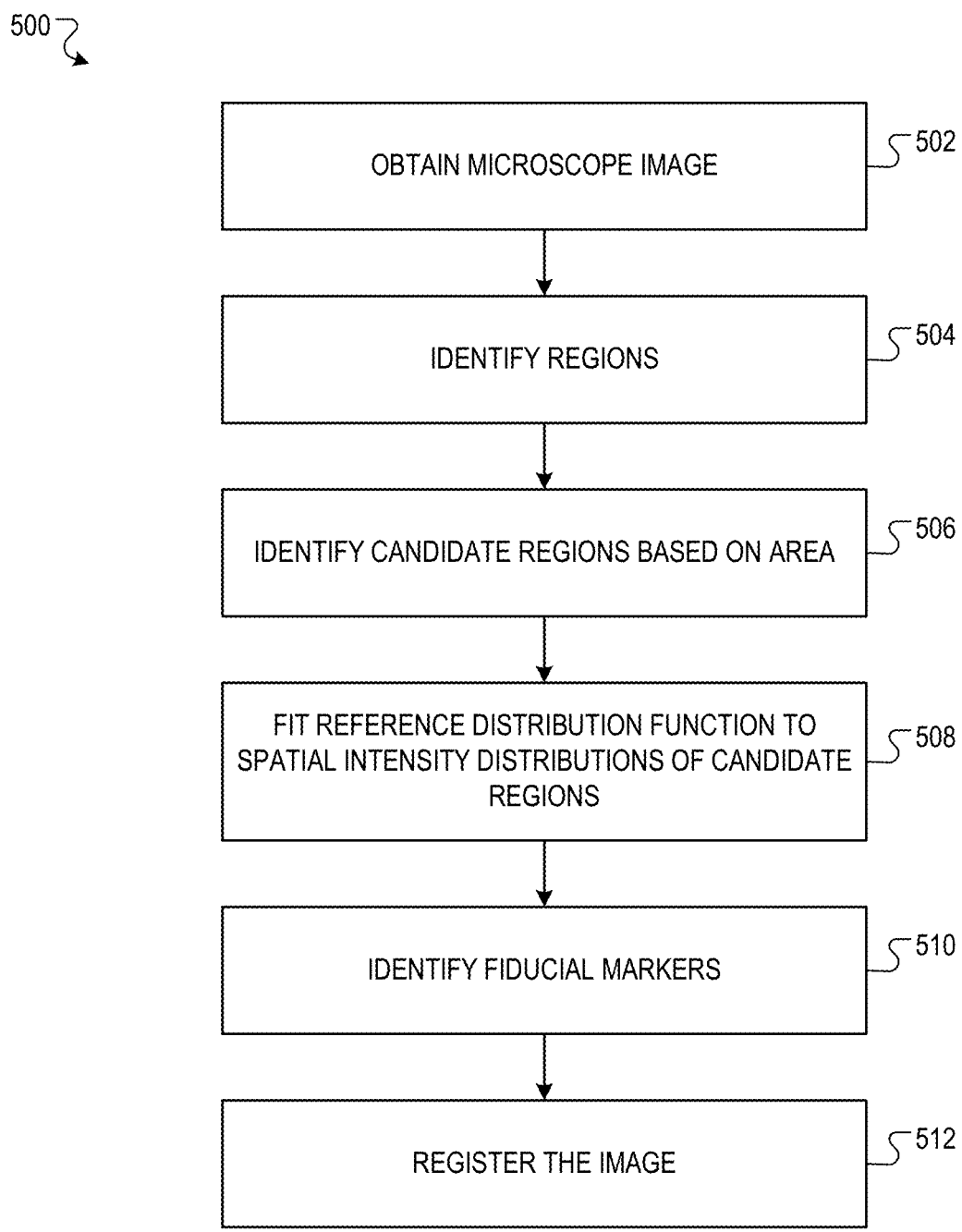
FIG. 5 is a flow diagram of an example process for identifying fiducial markers in a microscope image depicting a sample and a set of fiducial markers.

FIG. 5 is a flow diagram of an example process 500 for identifying fiducial markers in a microscope image depicting a sample and a set of fiducial markers. For convenience, the process 500 will be described as being performed by a system of one or more computers located in one or more locations. For example, a fiducial identification system, e.g., the fiducial identification system 106 of FIG. 2, appropriately programmed in accordance with this specification, can perform the process 500.

The system obtains a microscope image depicting a sample and a set of fiducial markers (502). In one implementation, the microscope image is a fluorescence microscope image and the sample and the set of fiducial markers are both depicted in the image due to having a common fluorescence color (e.g., green).

The system identifies a set of contiguous and non-overlapping regions in the image (504). The system identifies the regions by partitioning identified pixels in the image having at least a threshold intensity into respective regions, such that: (i) each identified pixel is included in one region, and (ii) any two adjacent identified pixels are included in the same region.

The system determines the area of each region to identify a set of "candidate" regions with areas that are consistent with them being fiducial markers (506). For example, the system may identify each region with an area that is in a predetermined range of area values as being a candidate region.

For each candidate region, the system determines respective parameter values of a reference distribution function that fit the reference distribution function to the spatial intensity distribution within the region (508). The reference distribution function may be, for example, a 2D Normal distribution with a diagonal covariance matrix. The system can use any appropriate fitting technique to determine respective parameter values of the reference distribution function for each candidate region, for example, an MLE technique.

The system identifies one or more of the candidate regions as being fiducial markers (510). The system determines whether each candidate region corresponds to a fiducial marker based on the reference distribution function fitted to the spatial intensity distribution within the candidate region. A few examples follow.

For example, the system may determine that a candidate region corresponds to a fiducial marker based at least in part on a similarity measure between: (i) the fitted reference distribution function for the candidate region, and (ii) the spatial intensity distribution within the candidate region. In this example, the system may determine that a candidate region corresponds to a fiducial marker only if the similarity measure is in a predetermined range of values. The system can use any appropriate similarity measure, for example, an MSE similarity measure.

As another example, the system may determine that a candidate region corresponds to a fiducial marker based at least in part on the parameter values of the reference distribution function fitted to the spatial intensity distribution within the candidate region. In this example, the system may determine that a candidate region corresponds to a fiducial marker only if the values of one or more parameters of the fitted reference distribution function are within respective predetermined ranges.

The system uses the fiducial markers to register the image to another image depicting the sample and the fiducial markers (512). An example process for using the fiducial markers to register the image is described in more detail with reference to FIG. 6. In some cases, the system may use the fiducial markers to register two microscope images having the same modality, e.g., two fluorescence microscope images or two electron microscope images. In some other cases, the system may use the fiducial markers to register microscope images having different modalities, e.g., a fluorescence microscope image and an electron microscope image.

Figure 6:
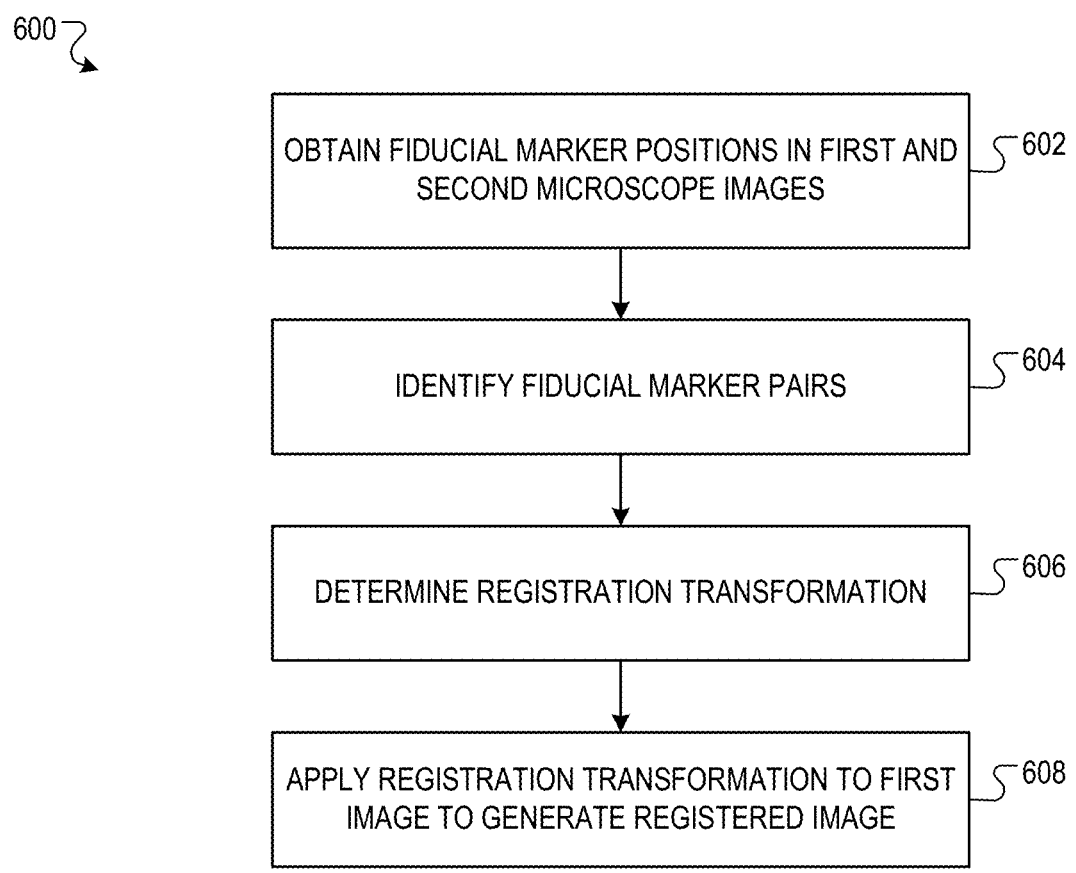
FIG. 6 is a flow diagram of an example process for registering a "first" microscope image to a "second" microscope image using respective fiducial markers depicted in each image.

FIG. 6 is a flow diagram of an example process 600 for registering a "first" microscope image to a "second" microscope image using respective fiducial markers depicted in each image. For convenience, the process 600 will be described as being performed by a system of one or more computers located in one or more locations. For example, a registration system, e.g., the registration system 112 of FIG. 1, appropriately programmed in accordance with this specification, can perform the process 600.

The system obtains data defining the positions of fiducial markers in the first image and the second image (602). An example process for identifying fiducial markers in a fluorescence microscope image is described in more detail with reference to FIG. 5.

The system identifies a set of fiducial marker pairs (604). Each fiducial marker pair includes: (i) a fiducial marker from the first image, and (ii) a corresponding fiducial marker from the second image. A given fiducial marker from the first image or the second image can be included in at most one fiducial marker pair. The system identifies the fiducial marker pairs using a nearest-neighbor matching technique (e.g., a greedy nearest-neighbor matching technique) that attempts to minimize the "distance" between the fiducial markers in respective fiducial marker pairs. The distance between a pair of fiducial markers may be, for example, a Euclidean distance.

After identifying a set of fiducial marker pairs using the nearest-neighbor matching technique, the system can "filter" the fiducial marker pairs by removing one or more fiducial marker pairs from further consideration. For example, for each fiducial marker pair, the system can determine a displacement vector by subtracting the position of the fiducial marker in the first image from the position of the corresponding fiducial marker in the second image. Next the system can determine the respective magnitude of the displacement vector for each fiducial marker pair. The system can remove a fiducial marker pair from further consideration if the magnitude of the displacement vector for the fiducial marker pair is substantially different than the average displacement vector magnitude (e.g., differs from the average displacement vector magnitude by more than a predetermined threshold amount). The system can also determine a respective "angle" of each displacement vector (e.g., between 0 to $2\pi$ radians). The system can remove fiducial marker pairs from further consideration if their displacement vector angle is substantially different than the average displacement vector angle (e.g., differs from the average displacement vector magnitude by more than a predetermined threshold amount).

The system determines the parameters of a registration transformation using the fiducial marker pairs (606). In particular, the system determines a registration transformation that approximately aligns the positions of the first image fiducial markers with the positions of the corresponding second image fiducial markers. The registration transformation may be, for example, an affine transformation or an elastic transformation. The system can determine the parameters of the registration transformation using any appropriate optimization procedure, for example, a gradient descent optimization procedure.

The system generates a registered image by applying the registration transformation to the first image to align it with the second image (608). The registered image can be provided to a user of the system, for example, through an API made available by the system.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework, a Microsoft Cognitive Toolkit framework, an Apache Singa framework, or an Apache MXNet framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method performed by one or more data processing apparatus, the method comprising:
   obtaining a microscope image that depicts a sample and a plurality of fiducial markers;
   identifying the plurality of fiducial markers in the image, including comparing a spatial intensity distribution of a plurality of regions of the image to a reference distribution function, wherein comparing the spatial intensity distribution of the plurality of regions of the image to the reference distribution function comprises, for each region:
      determining respective parameter values of the reference distribution function that fit the reference distribution function to the spatial intensity distribution of the region; and
   using the plurality of fiducial markers to register the image.

2. The method of claim 1, wherein obtaining the microscope image comprises obtaining an electron microscope image.

3. The method of claim 1, wherein the plurality of fiducial markers comprise metal nanoparticles.

4. The method of claim 3, wherein the metal nanoparticles comprise one or more of: gold nanoparticles, silver nanoparticles, copper nanoparticles, and cobalt nanoparticles.

5. The method of claim 2, further comprising:
   obtaining a fluorescence microscope image that depicts the sample and the plurality of fiducial markers;
   wherein using the plurality of fiducial markers to register the image comprises:
      using the plurality of fiducial markers to register the electron microscope image and the fluorescence microscope image.

6. The method claim 1, further comprising, for each region:
   determining a similarity measure between the reference distribution function with the respective parameter values and the spatial intensity distribution of the region; and determining whether the region corresponds to a fiducial marker based at least in part on the similarity measure between the reference distribution function with the respective parameter values and the spatial intensity distribution of the region.

7. The method of claim 1, further comprising, for each region:
determining whether the region corresponds to a fiducial marker based at least in part on the respective parameter values of the reference distribution function.

8. The method of claim 1, wherein:
the reference distribution function is a two-dimensional Normal distribution function;
determining respective parameter values of the reference distribution function comprises determining respective mean and covariance parameter values of the reference distribution function.

9. The method of claim 6, wherein determining the similarity measure between the reference distribution function with the respective parameter values and the spatial intensity distribution of the region comprises:
determining a mean-squared-error (MSE) between the reference distribution function with the respective parameter values and the spatial intensity distribution of the region.

10. The method of claim 1, wherein identifying the plurality of fiducial markers comprises:
determining a respective area of each of the plurality of regions of the image; and
for each region, determining whether the region corresponds to a fiducial marker based at least in part on the area of the region.

11. The method of claim 1, wherein the sample comprises RNA molecules and the fiducial markers are beads.

12. The method of claim 1, wherein:
obtaining a microscope image that depicts a sample and a plurality of fiducial markers comprises:
obtaining a fluorescence microscope image that depicts a sample and a plurality of fiducial markers, the sample and the plurality of fiducial markers having a common fluorescence color; and
comparing a spatial intensity distribution of a plurality of regions of the image to a reference distribution function comprises:
comparing a spatial intensity distribution of a plurality of fluorescent regions of the image to a reference distribution function.

13. A system comprising one or more computers and one or more storage devices storing instructions that when executed by the one or more computers cause the one or more computers to perform operations comprising:
obtaining a microscope image that depicts a sample and a plurality of fiducial markers;
identifying the plurality of fiducial markers in the image, including comparing a spatial intensity distribution of a plurality of regions of the image to a reference distribution function, wherein comparing the spatial intensity distribution of the plurality of regions of the image to the reference distribution function comprises, for each region:
determining respective parameter values of the reference distribution function that fit the reference distribution function to the spatial intensity distribution of the region; and
using the plurality of fiducial markers to register the image.

14. The system of claim 13, wherein obtaining the microscope image comprises obtaining an electron microscope image.

15. The system of claim 13, wherein the plurality of fiducial markers comprise metal nanoparticles.

16. The system of claim 15, wherein the metal nanoparticles comprise one or more of: gold nanoparticles, silver nanoparticles, copper nanoparticles, and cobalt nanoparticles.

17. The system of claim 14, wherein the operations further comprise:
obtaining a fluorescence microscope image that depicts the sample and the plurality of fiducial markers;
wherein using the plurality of fiducial markers to register the image comprises:
using the plurality of fiducial markers to register the electron microscope image and the fluorescence microscope image.

18. One or more non-transitory computer storage media storing instructions that when executed by one or more computers cause the one or more computers to perform operations comprising:
obtaining a microscope image that depicts a sample and a plurality of fiducial markers;
identifying the plurality of fiducial markers in the image, including comparing a spatial intensity distribution of a plurality of regions of the image to a reference distribution function, wherein comparing the spatial intensity distribution of the plurality of regions of the image to the reference distribution function comprises, for each region:
determining respective parameter values of the reference distribution function that fit the reference distribution function to the spatial intensity distribution of the region; and
using the plurality of fiducial markers to register the image.

19. The non-transitory computer storage media of claim 18, wherein obtaining the microscope image comprises obtaining an electron microscope image.

20. The non-transitory computer storage media of claim 18, wherein the plurality of fiducial markers comprise metal nanoparticles.

* * * * *